US008921919B2

(12) United States Patent
Kuroe et al.

(10) Patent No.: US 8,921,919 B2
(45) Date of Patent: Dec. 30, 2014

(54) SEMICONDUCTOR DEVICE AND SEMICONDUCTOR DEVICE MANUFACTURING METHOD

(75) Inventors: Hiroyuki Kuroe, Yokkaichi (JP); Shoichi Watanabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 13/415,124

(22) Filed: Mar. 8, 2012

(65) Prior Publication Data

US 2012/0241845 A1    Sep. 27, 2012

(30) Foreign Application Priority Data

Mar. 25, 2011    (JP) ................... 2011-068648

(51) Int. Cl.
*H01L 29/792*    (2006.01)
*H01L 49/02*    (2006.01)
*H01L 29/788*    (2006.01)
*H01L 27/115*    (2006.01)

(52) U.S. Cl.
CPC ............ *H01L 28/20* (2013.01); *H01L 29/7881* (2013.01); *H01L 27/11546* (2013.01)
USPC .............................. 257/324; 257/536; 438/592

(58) Field of Classification Search
None
See application file for complete search history.

(56) References Cited

U.S. PATENT DOCUMENTS

| 2006/0220003 A1 | 10/2006 | Noguchi et al. |
| 2006/0267143 A1 | 11/2006 | Sugimae et al. |
| 2009/0267177 A1* | 10/2009 | Ide et al. .................. 257/516 |

FOREIGN PATENT DOCUMENTS

| JP | 2006-294649 | 10/2006 |
| JP | 2007-266499 | 10/2007 |

* cited by examiner

*Primary Examiner* — Sonya D McCall Shepard
(74) *Attorney, Agent, or Firm* — Oblon, Spivak, McClelland, Maier & Neustadt, L.L.P.

(57) ABSTRACT

A first insulation film is on a substrate. A first resistance part is on the first insulation film. A boundary film is on the first resistance part. A second resistance part is on the boundary film. A second insulation film is on the second resistance part. A first conductive part and a second conductive part are on the second insulation film, and are isolated from each other. The first conductive part includes a first connection part penetrating the second insulation film and the second resistance part and contacting a surface of the boundary film. The second conductive part includes a second connection part penetrating the second insulation film and the second resistance part and contacting a surface of the boundary film. The first resistance part is connected to the first conductive part via the first connection part, and is connected to the second conductive part via the second connection part.

12 Claims, 16 Drawing Sheets

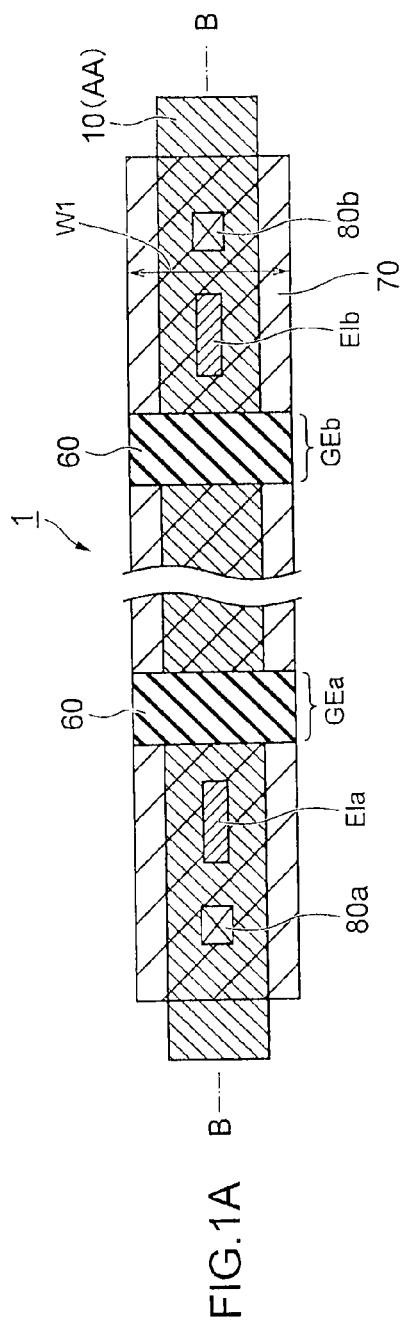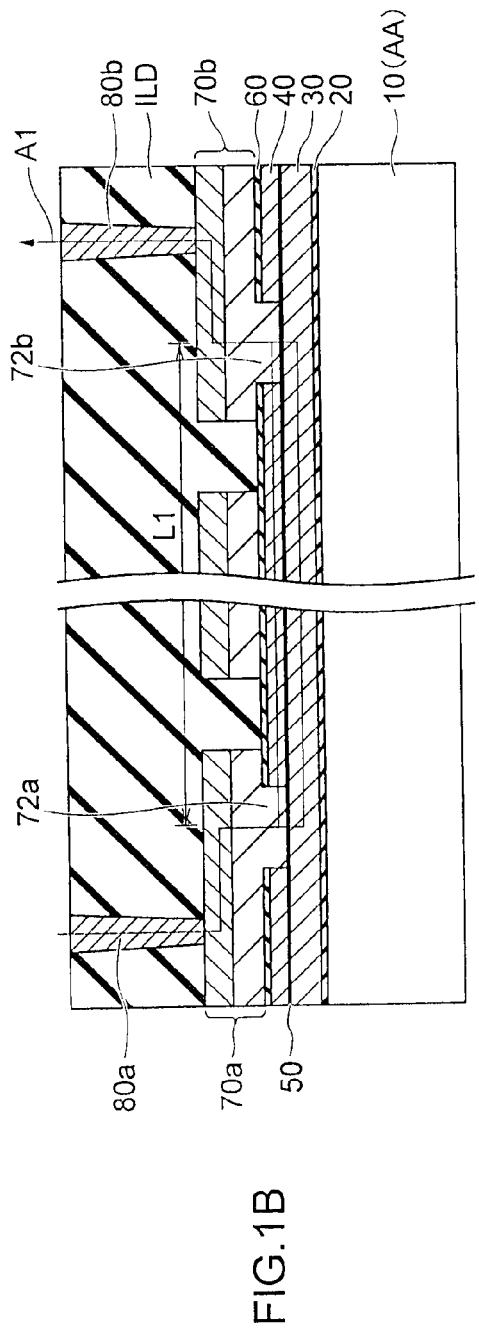
FIG.1A
FIG.1B

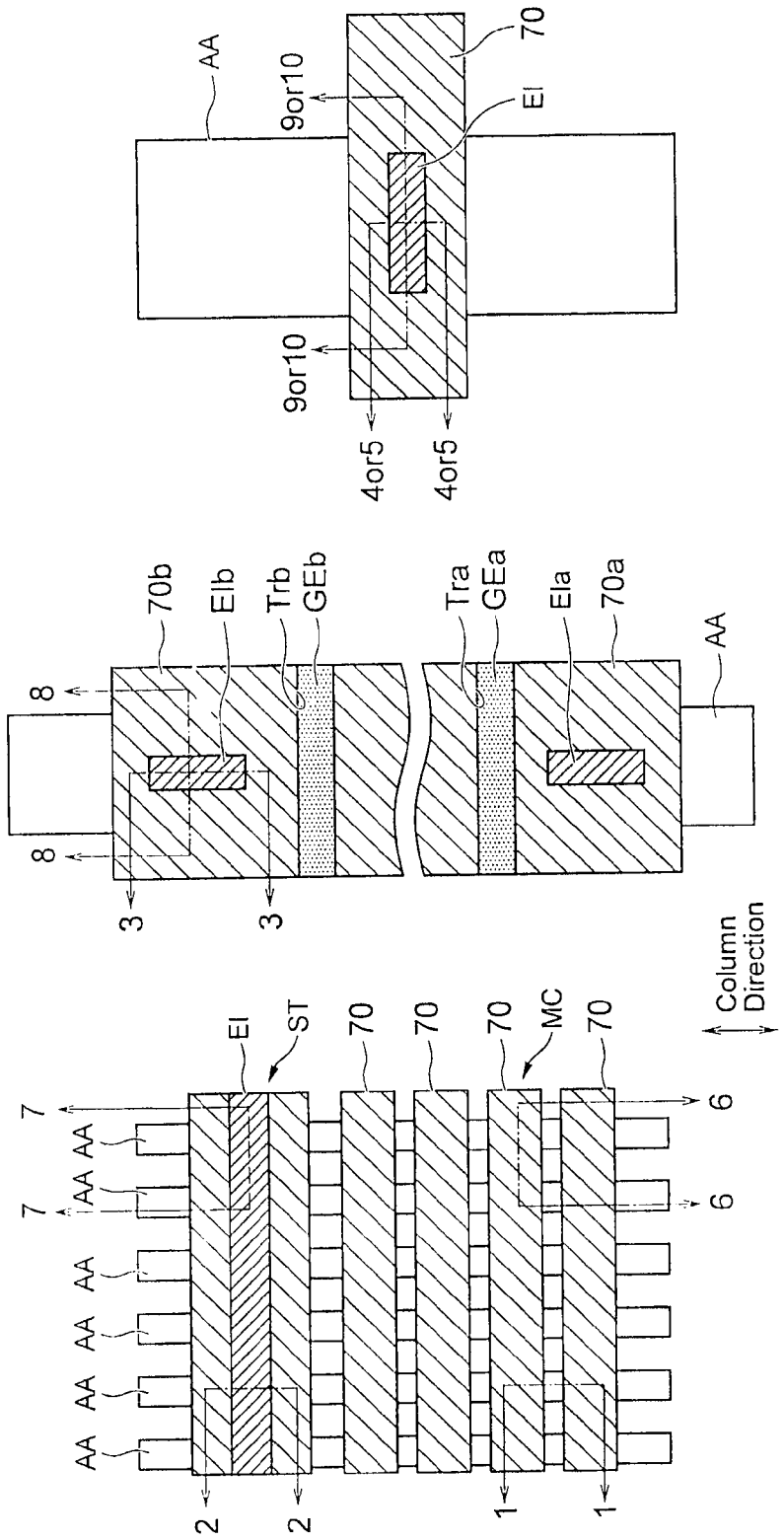

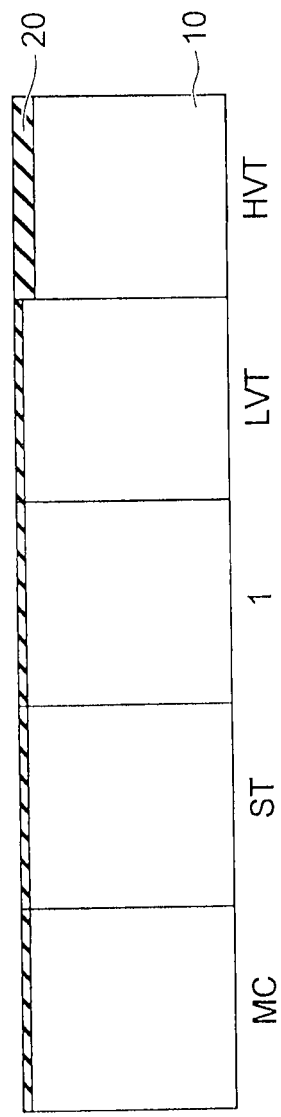
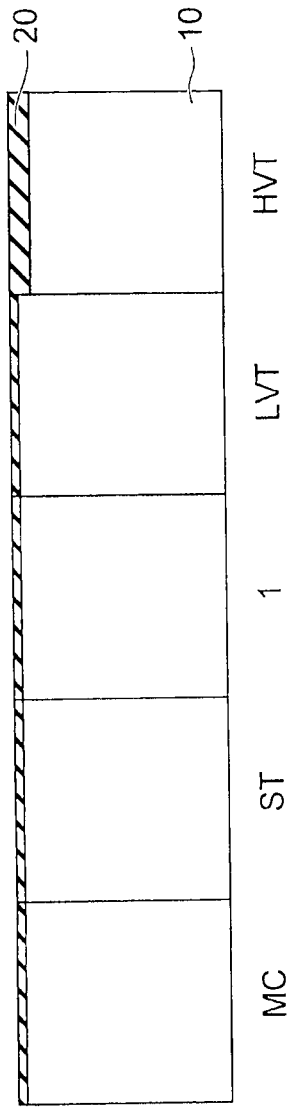
FIG.6A
FIG.6B

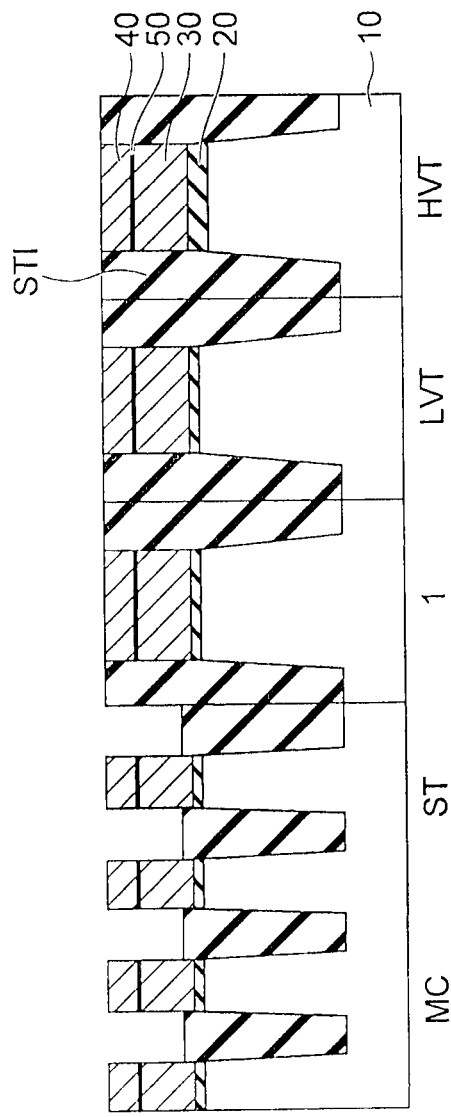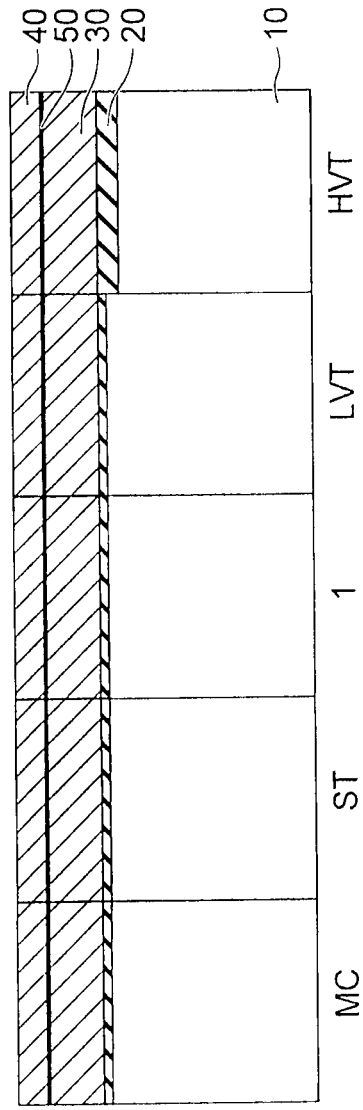
FIG.11A
FIG.11B

SEMICONDUCTOR DEVICE AND SEMICONDUCTOR DEVICE MANUFACTURING METHOD

CROSS REFERENCE TO RELATED APPLICATIONS

This application is based upon and claims the benefit of priority from the prior Japanese Patent Application No. 2011-68648, filed on Mar. 25, 2011, the entire contents of which are incorporated herein by reference.

FIELD

The embodiments of the present invention relate to a semiconductor device and manufacturing method thereof.

BACKGROUND

A semiconductor storage device such as a NAND EEPROM includes a memory cell array and peripheral circuits that drives the memory cell array. Semiconductor elements such as transistors, capacitors, and resistance elements are incorporated in the peripheral circuits of the semiconductor storage device such as the NAND EEPROM. Among these semiconductor elements, the resistance elements are used to set internal voltages generated in a booster circuit or to set units of clocks (a timer) for determining an operation timing of a memory circuit and the peripheral circuits. Therefore, fluctuations in resistances of the resistance elements cause fluctuations in the internal voltages or the timer, and this disadvantageously results in defective memory devices. To handle such a problem, it has been desired to suppress the fluctuations in the resistances of the resistance elements.

BRIEF DESCRIPTION OF THE DRAWINGS

FIGS. 1A and 1B are a plan view and a cross-sectional view, respectively showing a configuration of a resistance element 1 included in a semiconductor device according to a first embodiment;

FIG. 5A is a plan view of the memory cells MC and selective transistors ST included in the semiconductor device according to the first embodiment;

FIG. 5B is a plan view of the resistance element 1 included in the semiconductor device according to the first embodiment;

FIG. 5C is a plan view of a high-voltage transistor HVT (or a low-voltage transistor LVT) included in the semiconductor device according to the first embodiment;

FIGS. 6A to 15B are cross-sectional views showing a method of manufacturing the semiconductor device according to the first embodiment;

DETAILED DESCRIPTION

Figure 2:
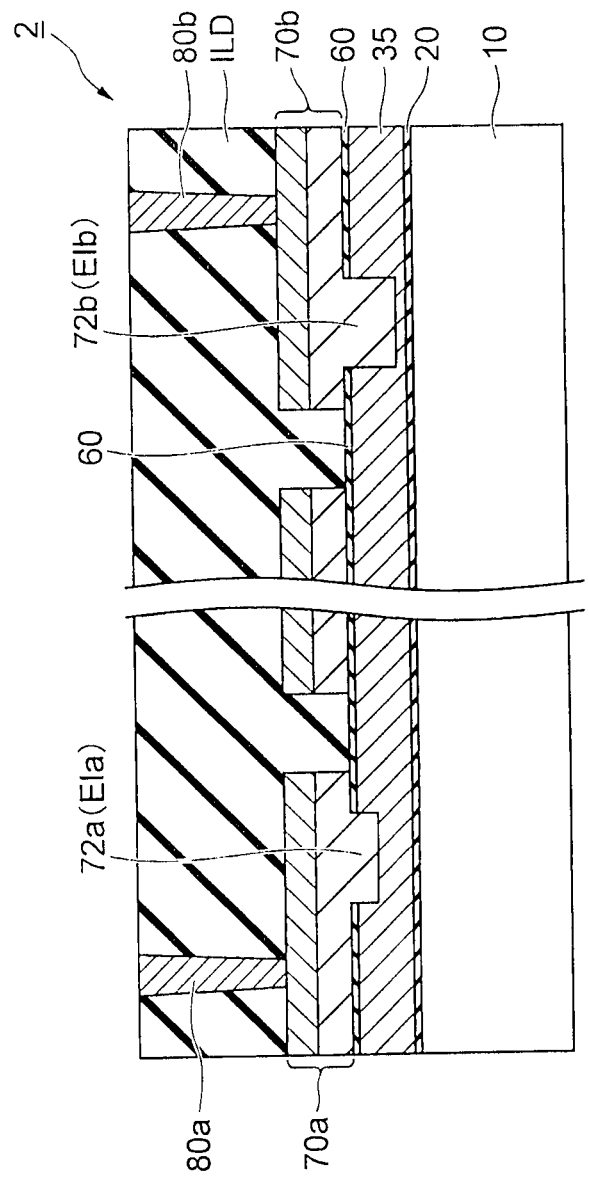
FIG. 2 is a cross-sectional view showing a configuration of a resistance element 2 as a comparative example.

A semiconductor device according to an embodiment includes a semiconductor substrate. A first insulation film is provided on the semiconductor substrate. A first resistance part is provided on the first insulation film, and is made of a conductive layer. A boundary film is provided on the first resistance part. A second resistance part is provided on the boundary film, and is made of a conductive layer. A second insulation film is provided on the second resistance part. A first conductive part and a second conductive part are provided on the second insulation film, and are isolated from each other. The first conductive part includes a first connection part penetrating the second insulation film and the second resistance part and contacting a surface of the boundary film. The second conductive part includes a second connection part penetrating the second insulation film and the second resistance part and contacting a surface of the boundary film. The first resistance part is electrically connected to the first conductive part via the first connection part, and is electrically connected to the second conductive part via the second connection part.

Embodiments will now be explained with reference to the accompanying drawings. The present invention is not limited to the embodiments.

First Embodiment

FIGS. 1A and 1B are a plan view and a cross-sectional view, respectively showing a configuration of a resistance element 1 included in a semiconductor device according to a first embodiment. FIG. 1B is a cross-sectional view taken along a line B-B of FIG. 1A. A semiconductor storage device such as a NAND EEPROM, although not limited thereto, can be employed as the semiconductor device according to the first embodiment. In this case, the resistance element 1 can be formed through the same manufacturing process as that of manufacturing memory cells MC. The configuration of the resistance element 1 is described below.

The resistance element 1 according to the first embodiment includes a silicon substrate 10 as a semiconductor substrate, a first insulation film 20, a first resistance part 30, a stopper film 50, a second resistance part 40, a second insulation film 60, a first conductive part 70a, and a second conductive part 70b.

The first insulation film 20 is provided on the silicon substrate 10 (an active area AA), and is a silicon oxide film or a high-k film higher in a dielectric constant than a silicon oxide film. The first resistance part 30 is provided on the first insulation film 30, and is made of a conductive material such as doped polysilicon.

The stopper film 50 as a boundary film is provided on the first resistance part 30, and is an insulation film such as a silicon oxide film. The stopper film 50 is provided in a boundary between the first resistance part 30 and the second resistance part 40. The stopper film 50 is made of a material different in an etching rate from a material (such as doped polysilicon) of the second resistance part 40 so as to function as an etching stopper for the second resistance part 40. Furthermore, the stopper film 50 is formed thinner than the first insulation film 20 and the second insulation film 60, and formed thin so as to electrically connect the first and second conductive parts 70a and 70b to the first resistance part 30. That is, the stopper film 50 has a thickness enough for the stopper film 50 to function as the etching stopper and for the first and second conductive parts 70a and 70b to be electrically connected to the first resistance part 30. Although not limited thereto, the thickness of the stopper film 50 is 5 to 10 angstroms, for example.

The second resistance part 40 is provided on the stopper film 50, and is made of the same conductive material as that of the first resistance part 30. The second insulation film 60 is provided on the second resistance part 40, and is, for example, a silicon oxide film or a high-k film higher in the dielectric constant than the silicon oxide film. The first and second conductive parts 70a and 70b are provided on the second insulation film 60, and are made of a conductive material such as doped polysilicon or silicide. As shown in FIG. 1B, the first and second conductive parts 70a and 70b are formed by a multilayer film having a silicide layer provided on a doped polysilicon layer. Although being the same multilayer film, the first and second conductive parts 70a and 70b are electrically isolated from each other.

The first conductive film 70a includes a first connection part 72a that penetrates the second insulation film 60 and the second resistance part 40 and then contacts a surface of the stopper film 50. The second conductive film 70b includes a second connection part 72b that penetrates the second insulation film 60 and the second resistance part 40 and then contacts the surface of the stopper film 50.

The first resistance part 30 has one end electrically connected to the first conductive part 70a via the first connection part 72a, and the other end electrically connected to the second conductive part 70b via the second connection part 72b. The first resistance part 30 thereby functions as a resistor. The second resistance part 40 is in contact with side surfaces of the first and second connection parts 72a and 72b, and therefore functions as the resistor together with the first resistance part 30.

The first and second conductive parts 70a and 70b are covered with an interlayer dielectric film ILD. Furthermore, contact plugs 80a and 80b provided in the interlayer dielectric film ILD are connected to the first and second conductive parts 70a and 70b, respectively.

A current flows in a direction indicated by an arrow A1 (or in an opposite direction to the arrow A1 direction) shown in FIG. 1B, by giving a voltage difference between the contact plugs 80a and 80b. The structure shown in FIGS. 1A and 1B thereby functions as the resistance element 1.

In FIG. 1A, EIa and EIb denote regions where the second insulation film 60 and the second resistance part 40 are etched and where the first and second connection parts 72a and 72b are formed, respectively. The second insulation film 60 is a film formed in the same layer as that in which an IPD (Inter Poly Dielectric) film (described later) is formed. Therefore, the regions EIa and EIb are referred to as "IPD etching regions EIa and EIb", hereinafter. Moreover, GEa and GEb are regions where the materials of the first and second conductive parts 70a and 70b are etched for the dielectric isolation therebetween. The first and second conductive parts 70a and 70b are formed by a film in the same layer as that in which a control gate 70 is formed. Therefore, the regions GEa and GEb are referred to as "CG etching regions GEa and GEb", hereinafter.

The resistance of the resistance element 1 is determined by a contact resistance R1 between the contact plug 80a and the first conductive part 70a, a resistance R2 of the first conductive part 70a (including the first connection part 72a) itself, a contact resistance R3 between the first connection part 72a and the first resistance part 30 (and the second resistance part 40), a resistance R4 of the first resistance part 30 (and the second resistance part 40) itself, a contact resistance R5 between the first resistance part 30 (and the second resistance part 40) and the second connection part 72b, a resistance R6 of the second conductive part 70b (including the second connection part 72b) itself, and a contact resistance R7 between the second conductive part 70b and the contact plug 80b.

The resistances R1, R2, R6, and R7 are much lower than the resistances R3, R4, and R5 and thus ignorable. Therefore, the resistance of the resistance element 1 is substantially R3+R4+R5.

The resistance R4 of the first resistance part 30 (and the second resistance part 40) is determined by a width W1 of the first resistance part 30 (or the second resistance part 40), a length L1 between the first and second connection part 72a and 72b (length between EIa and EIb), and a concentration C1 of impurities (of phosphorus, for example) contained in the first resistance part 30 (and the second resistance part 40). The thickness of the first resistance part 30 and the second resistance part 40 is much smaller in fluctuations from the width W1, the length L1, and the concentration C1 and thus ignorable. Therefore, to suppress the fluctuation in the resistance R4, it is necessary to reduce fluctuations in the W1, L1, and C1.

On the other hand, the contact resistance R3 between the first connection part 72a and the first resistance part 30 (and the second resistance part 40) is determined by a contact area between the first connection part 72a and the first resistance part 30 (the stopper film 50), a contact area between the first connection part 72a and the second resistance part 40, and the thickness of the stopper film 50. The contact resistance R5 between the first resistance part 30 (and the second resistance part 40) and the second connection part 72b is determined by a contact area between the second connection part 72b and the first resistance part 30 (the stopper film 50), a contact area between the second connection part 72b and the second resistance part 40, and the thickness of the stopper film 50.

Therefore, to suppress fluctuations in the resistances R3 and R5, it is necessary to reduce fluctuations in the thickness of the stopper film 50 and in the contact areas between the first and second connection parts 72a and 72b and the first and second resistance parts 30 and 40.

In the semiconductor device according to the first embodiment, the first and second connection part 72a and 72b can be formed so that the contact area between the first connection part 72a and the stopper film 50 is substantially equal to that between the second connection part 72b and the stopper film 50 by lithography and etching. That is, the IPD etching regions EIa and EIb shown in FIG. 1A can be formed so as to be substantially equal to each other in an area by lithography and etching. Furthermore, the stopper film 50 can be formed to have the substantially uniform thickness as a natural oxide film, a thermal oxide film or a deposited insulation film.

Moreover, in the first embodiment, bottoms of the first and second connection parts 72a and 72b contact the surface of the stopper film 50. The stopper film 50 thereby determines depths (or thicknesses) of the first and second connection parts 72a and 72b. The stopper film 50 functions as the etching stopper for the second resistance part 40 as described later. The first connection part 72a is substantially equal in the depth or thickness to the second connection part 72b because the stopper film 50 is formed on the flat first resistance part 30. This follows that the contact area between the first connection part 72a and the second resistance part 40 is substantially equal to that between the second connection part 72b and the second resistance part 40.

With the configuration described above, the resistance element 1 according to the first embodiment can reduce the fluctuations in the thickness of the stopper film 50 and those in the contact areas between the first and second connection parts 72a and 72b and the first and second resistance parts 30 and 40. Therefore, since the fluctuations of the resistances R3 and R5 are reduced, the fluctuation in the resistance of the resistance element 1 can be suppressed.

FIG. 2 is a cross-sectional view showing a configuration of a resistance element 2 as a comparative example. The resistance element 2 does not include the stopper film 50. Therefore, in the resistance element 2, the first and second resistance parts 30 and 40 are formed as an integral resistance part 35.

Generally, when etching the second insulation film 60 and the resistance part 35 in the IPD etching region EIa or EIb, an etching amount is excessively set to completely remove the second insulation film 60 present in the IPD etching region EIa or EIb. Therefore, in portions where the second insulation film 60 is removed quickly, the etching amount by which the resistance part 35 is etched becomes large. On the other hand, in portions where the second insulation film 60 is difficult to be removed, the etching amount by which the resistance part 35 is etched is small. Therefore, the depths of trenches in the IPD etching regions EIa and EIb tend to fluctuate. This increases fluctuations in the depths (or the thicknesses) of the first and second connection parts 72a and 72b. With the fluctuations in the depths (or the thicknesses) of the first and second connection parts 72a and 72b, even when the IPD etching regions EIa and EIb are formed to be equal in the area, the contact area between the side surface of the first connection part 72a and the resistance part 35 becomes different from that between the side surface of the second connection part 72b and the resistance part 35. This results in the fluctuations in the resistances R3 and R5, which disadvantageously causes fluctuations in the resistance of the resistance element 1 among semiconductor devices.

On the other hand, as described in the first embodiment, the use of the stopper film 50 can suppress the fluctuations in the resistances R3 and R5.

Figure 3:
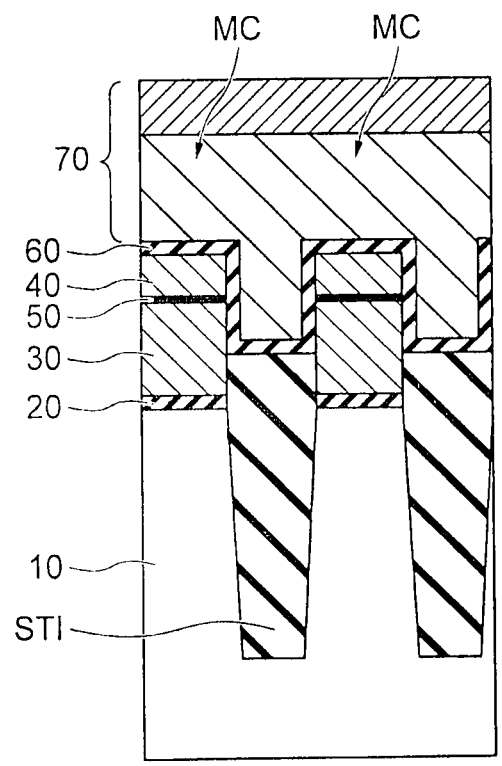
FIG. 3 is a cross-sectional view showing a configuration of the memory cells MC included in the semiconductor device according to the first embodiment.

FIG. 3 is a cross-sectional view showing a configuration of the memory cells MC included in the semiconductor device according to the first embodiment. Each of the memory cells MC according to the first embodiment includes a gate dielectric film 20, first and second floating gates 30 and 40 (charge storage layer), an IPD film 60 serving as an inter-gate dielectric film, and the control gate 70.

The gate dielectric film 20 is provided on the silicon substrate 10, and is a film formed in the same layer as that in which the first insulation film 20 is formed. The gate dielectric film 20 functions as a tunnel dielectric film. The first and second floating gates 30 and 40 are provided on the gate dielectric film 20, and are films formed in the same layers as those in which the first and second resistance parts 30 and 40 are formed, respectively. The first and second floating gates 30 and 40 are of a double-layer structure, and the stopper film 50 interposes between the first and second floating gates 30 and 40. The IPD film 60 is provided on the first and second floating gates 30 and 40, and is a film formed in the same layer as that in which the second insulation film 60 is formed. The control gate 70 is provided on the IPD film 60, and is a film formed in the same layer as that in which the first and second conductive parts 70a and 70b are formed.

Therefore, the first insulation film 20 is also referred to as "gate dielectric film 20", the first and second resistance parts 30 and 40 are also referred to as "first and second floating gates 30 and 40", the second insulation film 60 is also referred to as "IPD film 60", and the first and second conductive parts 70a and 70b are also referred to as "control gate 70" in the context of the memory cells MC, hereinafter.

In the memory cell MC according to the first embodiment, the first and second floating gates 30 and 40 are formed into the double-layer structure by the stopper film 50. The stopper film 50 is thin enough not to prevent electrical connection between the first and second floating gates 30 and 40. For example, a silicon oxide film at a thickness of 5 to 10 angstroms is used as the stopper film 50. Therefore, the first and second floating gates 30 and 40 can function as an integral floating gate 30, 40.

Figure 4:
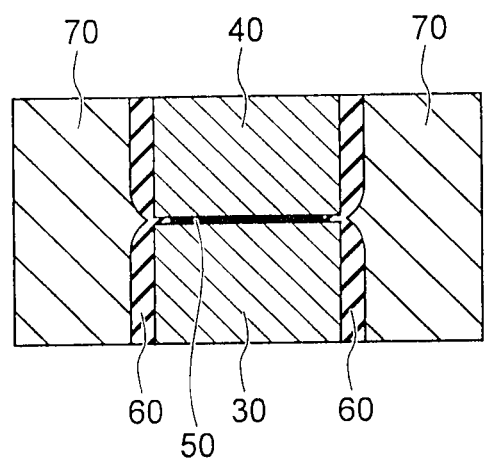
FIG. 4 is a cross-sectional view of the boundary between the first and second floating gates 30 and 40.

Furthermore, as shown in FIG. 4, constrictions (or recesses) are formed in a boundary between the first and second floating gates 30 and 40 by providing the stopper film 50 between the first and second floating gates 30 and 40. This is because the stopper film 50 is etched laterally when processing the first floating gate 30, the stopper film 50, and the second floating gate 40.

FIG. 4 is a cross-sectional view of the boundary between the first and second floating gates 30 and 40. The constrictions between the first and second floating gates 30 and 40 can increase the facing area by which the first and second floating gates 30 and 40 are opposed to the control gate 70, and increase the coupling capacitance between the first and second floating gates 30 and 40 and the control gate 70. The increased coupling capacitance between the first and second floating gates 30 and 40 and the control gate 70 can improve controllability over the memory cells MC and ensure satisfactory and effective data writing. This contributes to increasing the signal difference between data "0" and data "1".

FIG. 5A is a plan view of the memory cells MC and selective transistors ST included in the semiconductor device according to the first embodiment. FIG. 5B is a plan view of the resistance element 1 included in the semiconductor device according to the first embodiment. FIG. 5C is a plan view of a high-voltage transistor HVT (or a low-voltage transistor LVT) included in the semiconductor device according to the first embodiment. FIG. 5C is used for the high-voltage transistor HVT and the low-voltage transistor LVT herein because the high-voltage transistor HVT is the same in the plan view as the low-voltage transistor LVT. The semiconductor device according to the first embodiment is a NAND EEPROM, for example.

The memory cells MC, the selective transistors ST, the resistance element 1, and the high-voltage transistor HVT and low-voltage transistor LVT shown in FIGS. 5A to 5C are formed on the active area AA of the same silicon substrate 10 by the same semiconductor manufacturing process. The active area AA is surrounded by an element isolation region STI (Shallow Trench Isolation).

The selective transistors ST are provided on both ends of memory cell strings each including a plurality of the memory cells MC connected in series, and become conductive when one of the memory cells MC in the memory cell strings is accessed. The high-voltage transistor HVT and the low-voltage transistor LVT as well as the resistance element 1 are used in peripheral circuits of a memory cell array.

FIGS. 6A to 15B are cross-sectional views showing a method of manufacturing the semiconductor device according to the first embodiment. FIGS. 6A to 15B show cross sections of the memory cell MC, the selective transistor ST, the resistance element 1, the low-voltage transistor LVT, and the high-voltage transistor HVT in a direction from left to right. In FIGS. 6A to 15B, the drawings indicated by a symbol "A" are cross-sectional views in a column direction and those indicated by a symbol "B" are cross-sectional views in a row direction. The cross sections of the memory cell MC, the selective transistor ST, the resistance element 1, the low-voltage transistor LVT, and the high-voltage transistor HVT shown in FIG. 6A correspond to those taken along lines 1-1 and 2-2 of FIG. 5A, a line 3-3 of FIG. 5B, and lines 4-4 and 5-5 of FIG. 5C, respectively. The cross sections of the memory cell MC, the selective transistor ST, the resistance element 1, the low-voltage transistor LVT, and the high-voltage transistor HVT shown in FIG. 6B correspond to those taken along lines 6-6 and 7-7 of FIG. 5A, a line 8-8 of FIG. 5B, and lines 9-9 and 10-10 of FIG. 5C, respectively. A current flowing direction in the resistance element 1 shown in FIG. 5B and a current flowing direction (a channel length direction) in the low-voltage transistor LVT and the high-voltage transistor HVT are the column direction. However, the current flowing direction of the resistance element 1, the low-voltage transistor LVT, and the high-voltage transistor HVT are not limited to the column direction. Therefore, the current flowing direction of the resistance element 1, the low-voltage transistor LVT, and the high-voltage transistor HVT can be the row direction or an oblique direction with respect to the row and column directions. The method of manufacturing the semiconductor device according to the first embodiment is described while assuming, for the sake of convenience, that the current flowing direction of the resistance element 1, the low-voltage transistor LVT, and the high-voltage transistor HVT is the column direction.

The method of manufacturing a NAND EEPROM as the semiconductor device according to the first embodiment is explained with reference to FIGS. 6A to 15B. A heating process and forming processes of forming a channel and a diffusion layer are not directly relevant to the resistance element 1. Therefore, explanations thereof will be omitted.

First, as shown in FIGS. 6A and 6B, the gate dielectric film (first insulation film) 20 is formed on the silicon substrate 10. The gate dielectric film 20 serves as the tunnel dielectric film for the memory cell MC, and serves as the gate dielectric film for each of the selective transistor ST and the peripheral transistors LVT and HVT.

In a region of forming the high-voltage transistor HVT, the gate dielectric film 20 is formed selectively thick. For example, the thickness of the gate dielectric film 20 for the low-voltage transistor LVT is about 6 to 10 nm and that for the high-voltage transistor HVT is about 30 to 50 nm. The high-voltage transistor HVT is thereby higher in a breakdown voltage than that of the low-voltage transistor LVT. Other configurations and processes in the manufacturing method of the high-voltage transistor HVT can be the same as those of the low-voltage transistor LVT.

The thickness of the gate dielectric film (first insulation film) 20 of the resistance element 1 is not limited to a specific value as long as the gate dielectric film 20 at the thickness can resist the voltage difference between the first resistance part 30 and the silicon substrate 10. However, for simplicity of the manufacturing process, the thickness of the first insulation film 20 of the resistance element 1 is preferably equal to that of the gate dielectric film 20 of either the high-voltage transistor HVT or the low-voltage transistor LVT.

To make uniform the height of the surface of the gate dielectric film 20, the surface of the silicon substrate 10 in the region of forming the high-voltage transistor HVT is lower than that in the regions of forming other elements. However, it is not always necessary to set the surface of the silicon substrate 10 in the region of forming the high-voltage transistor HVT lower than that in the regions of forming the other elements.

Figure 7A:
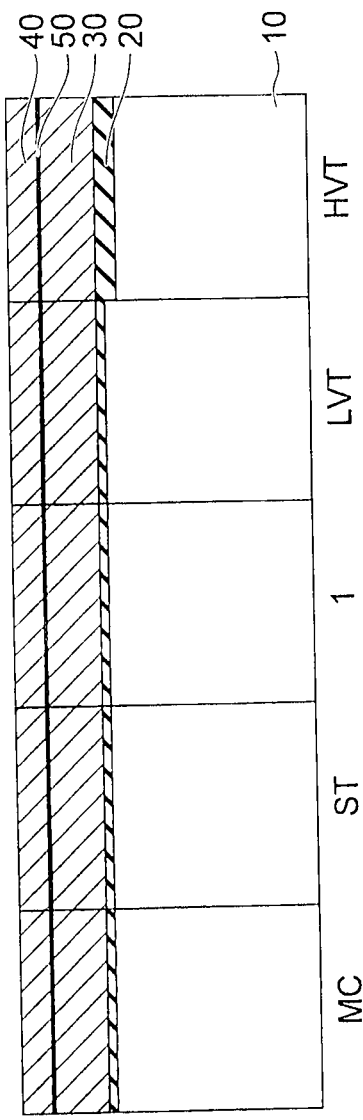
Figure 7B:
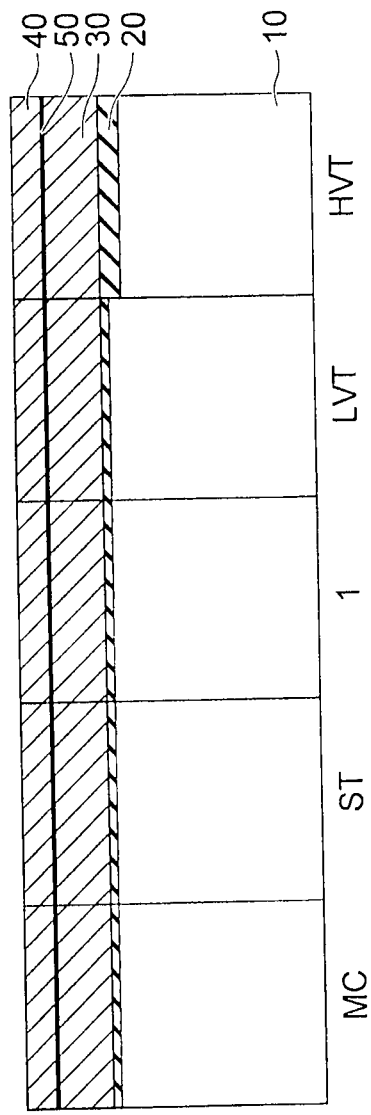

Next, the material of the first floating gate (first resistance part) 30 is deposited, as a first conductive layer, on the gate dielectric film 20 by LPCVD (Low Pressure-Chemical Vapor Deposition). For example, the material of the first floating gate 30 is doped polysilicon containing impurities such as phosphorus, arsenic, or boron. The stopper film 50 is formed on the material of the first floating gate 30. Furthermore, the material of the second floating gate (second resistance part) 40 is deposited, as a second conductive layer, on the stopper film 50 by the LPCVD. For example, the material of the second floating gate 40 is doped polysilicon containing impurities such as phosphorus, arsenic, or boron. The same material as that of the first floating gate 30 can be used for the second floating gate 40. In this way, the structure shown in FIGS. 7A and 7B is obtained.

The stopper film 50 is formed by an insulation film such as a silicon oxide film, for example. The first floating gate 30, the stopper film 50, and the second floating gate 40 can be formed continuously by using the respective materials in the same chamber in one process while changing film formation gases. Alternatively, between the process of depositing the first floating gate 30 and the process of depositing the second floating gate 40, the stopper film 50 can be deposited by the LPCVD or the like in a different process. In another alternative, after the deposition of the first floating gate 30, the first floating gate 30 can be temporarily exposed to the air to thereby form the natural oxide film serving as the stopper film 50 on the first floating gate 30.

The stopper film 50 functions as the etching stopper when subsequently etching the second floating gate 40 by RIE (Reactive Ion Etching) or CDE (Chemical Dry Etching). Therefore, the material (for example, silicon oxide film or silicon nitride film) lower in the etching rate than the material (for example, doped polysilicon) of the second floating gate 40 is used for the stopper film 50. The material of the stopper film 50 is preferably the silicon oxide film in view of fluctuations in threshold voltages of transistors and the like because the silicon nitride film has a property of trapping electrons.

The thickness of the stopper film 50 is set to a thickness such that the stopper film 50 does not hinder the conductive properties between the first floating gate 30 and the second floating gate 40 while functioning as the etching stopper. For example, the thickness of the stopper film 50 is 5 to 10 angstroms. If the stopper film 50 is too thin, the first floating gate 30 under the stopper film 50 is etched when etching the material of the second floating gate 40. On the other hand, if the stopper film 50 is too thick, characteristics of the memory cells MC, the selective transistors ST, and the transistors LVT and HVT possibly deteriorate.

Figure 8A:
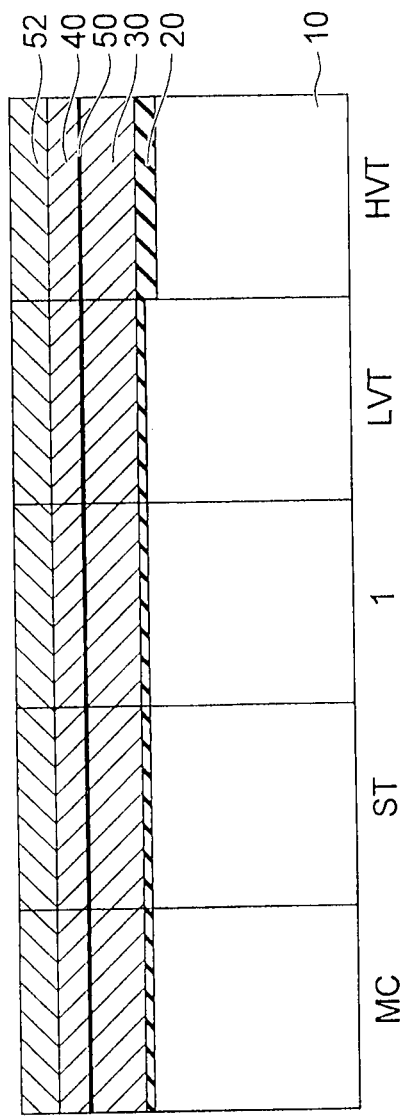
Figure 8B:
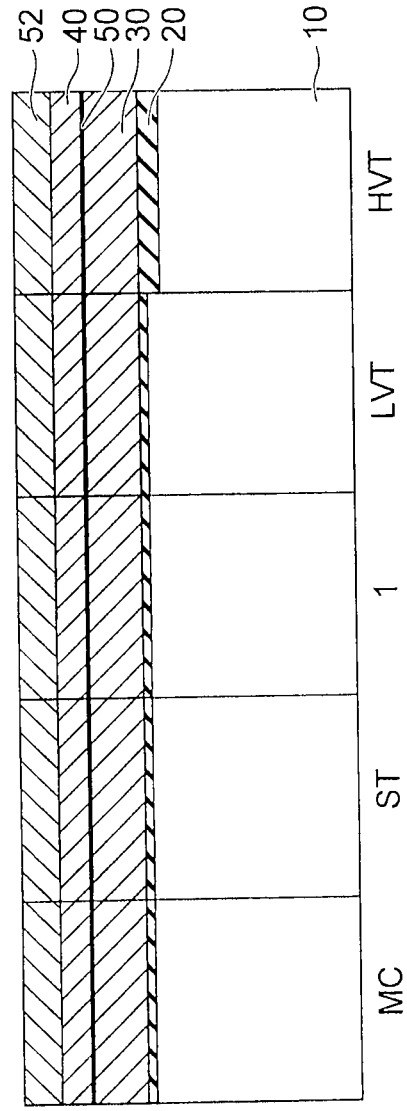

Next, as shown in FIGS. 8A and 8B, the material of a hard mask 52 is deposited on the second floating gate 40. The material of the hard mask 52 is a silicon nitride film, for example.

The hard mask 52 is processed into a plane pattern of the first and second floating gates 30 and 40 by the lithography and RIE. The first and second floating gates 30 and 40 are thereby formed. At this time, the hard mask 52 is processed into a pattern of a gate electrode in the regions of forming the selective transistor ST and the transistors LVT and HVT. In the region of forming the resistance element 1, the hard mask 52 is processed into a pattern of the first and second resistance parts 30 and 40.

Figure 9A:
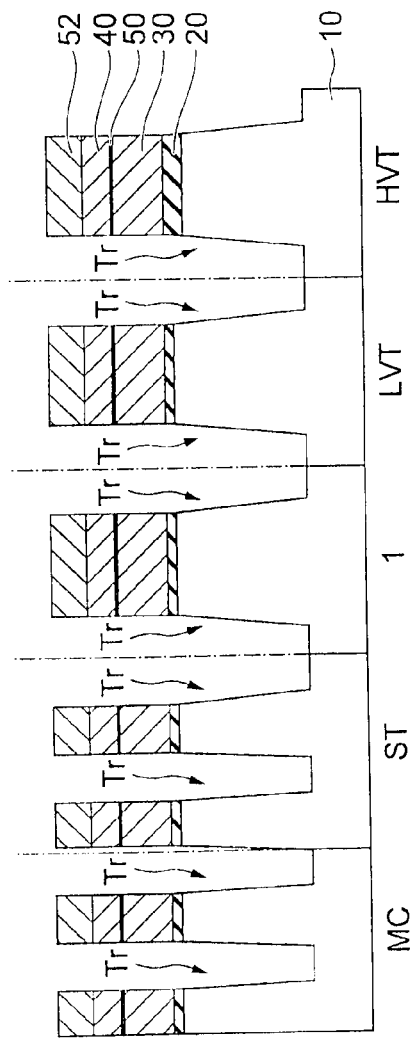
Figure 9B:
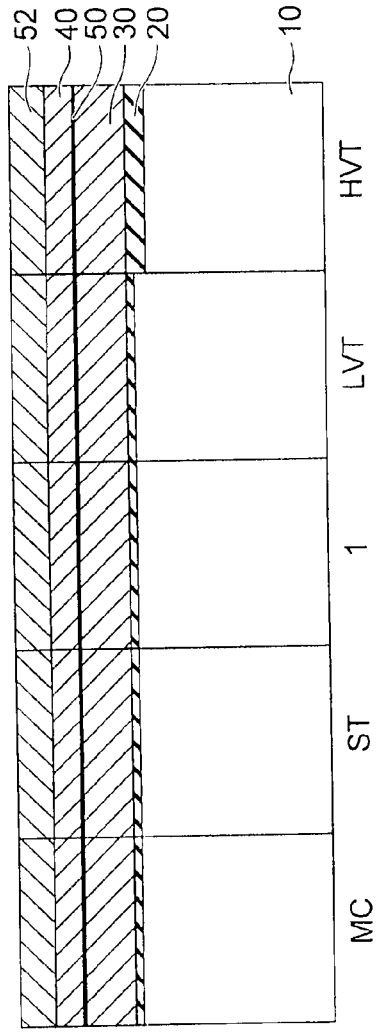

In this etching process, trenches Tr for the element isolation region STI are also formed. As a result, the structure shown in FIGS. 9A and 9B is obtained.

Figures 10A, 10B:
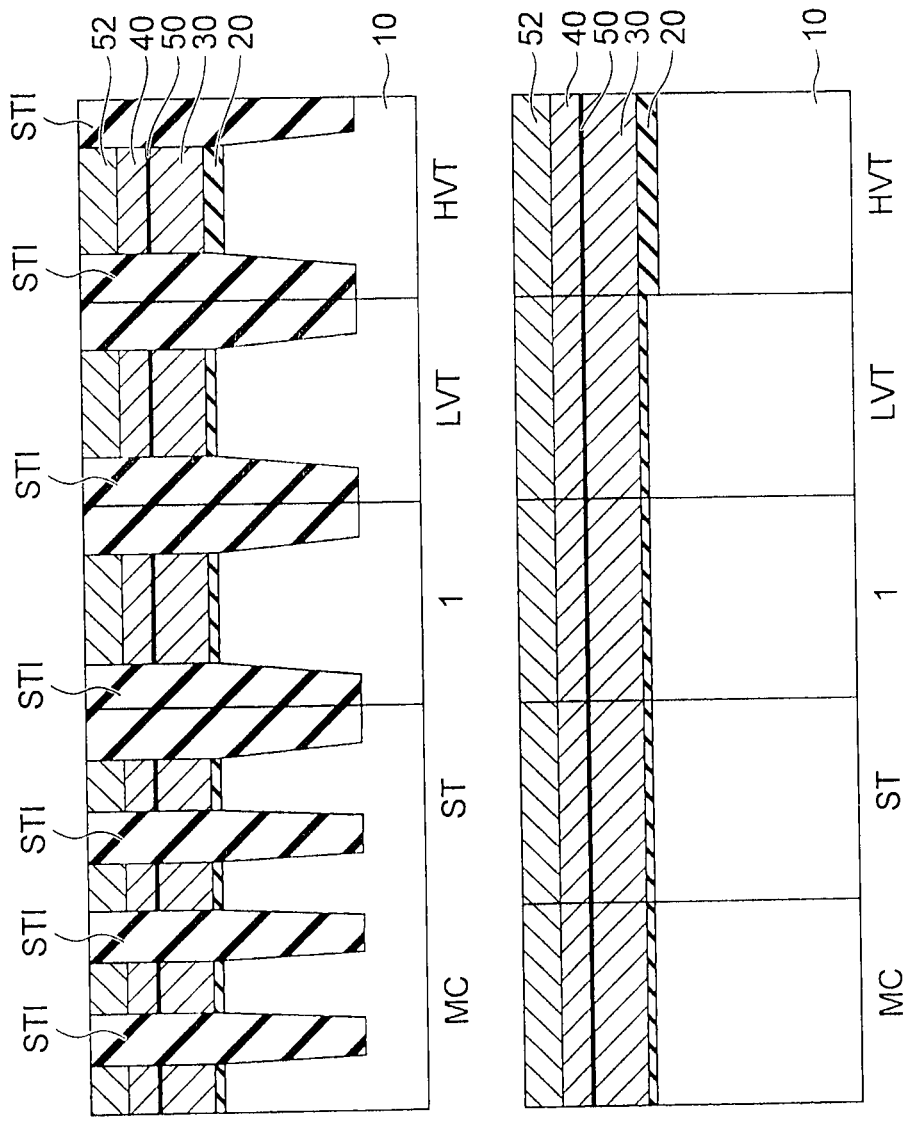

Next, the material of the element isolation region STI is deposited on the hard mask 52 and filled up in the trenches Tr. The material of the element isolation region STI is a silicon oxide film, for example. The material of the element isolation region STI is polished by CMP (Chemical Mechanical Polishing) until the surface of the hard mask 52 is exposed. As a result, the structure shown in FIGS. 10A and 10B is obtained.

Next, an upper portion of the element isolation region STI present in the regions of forming the memory cell MC and the selective transistor ST is selectively etched by the lithography and RIE. At this time, the upper surface of the element isolation region STI is etched so as to be higher than that of the gate dielectric film 20 and lower than that of the stopper film 50. In this manner, the structure shown in FIGS. 11A and 11B is obtained. The stopper film 50 in the regions of forming the memory cell MC and the selective transistor ST is subjected to side-etching starting at portions exposed to the trenches Tr in conjunction with the etching of the element isolation region STI, as explained with reference to FIG. 4.

Figures 12A, 12B:
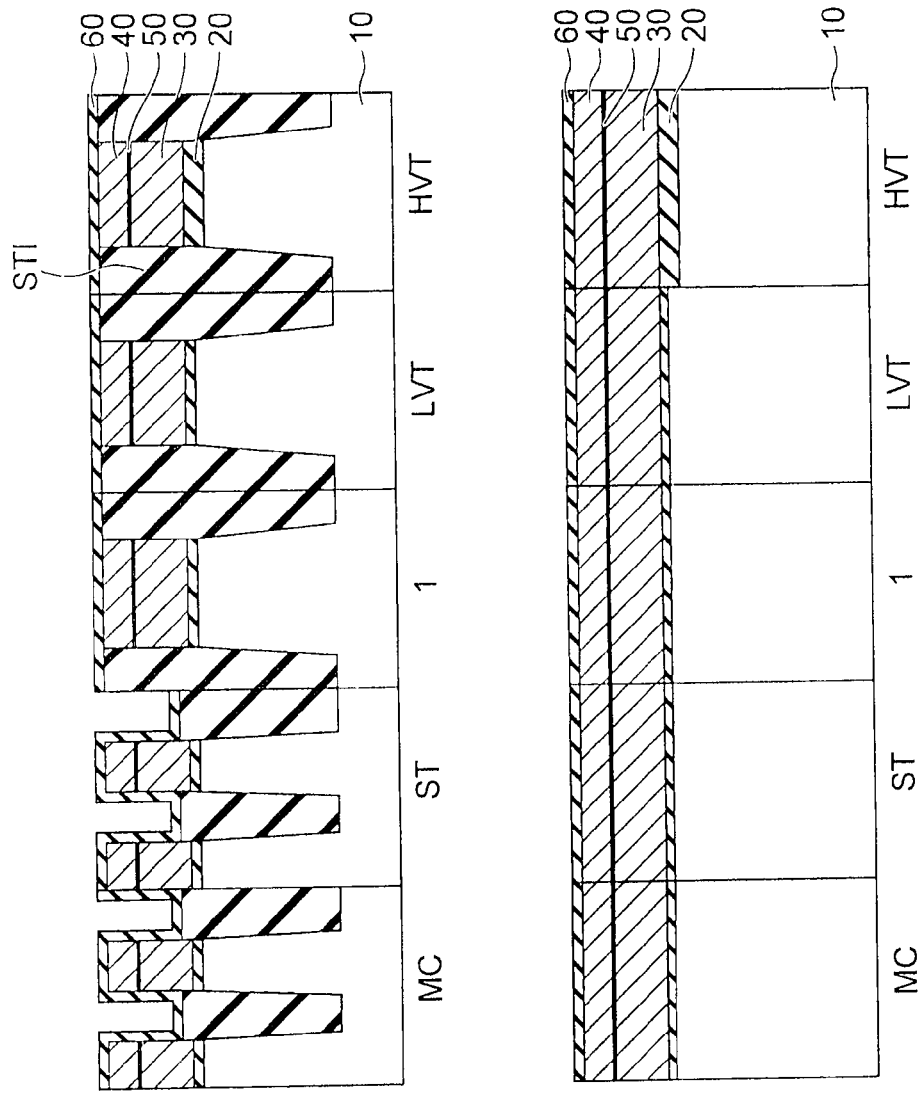

As shown in FIGS. 12A and 12B, the IPD film (second insulation film) 60 is deposited on surfaces and side surfaces of the first and second floating gates 30 and 40 and on the element isolation region STI by the LPCVD or the like. At this time, the IPD film 60 is deposited at a thickness enough not to bury the gaps between the adjacent memory cells MC. That is, the thickness of the IPD film 60 is less than half the gap between the adjacent memory cells MC. For example, although not limited thereto, the IPD film 60 is a multilayer film (an ONO film) including a silicon oxide film, a silicon nitride film, and silicon oxide film or a NONON film having a silicon nitride film provided on and under the ONO film.

Figures 13A, 13B:
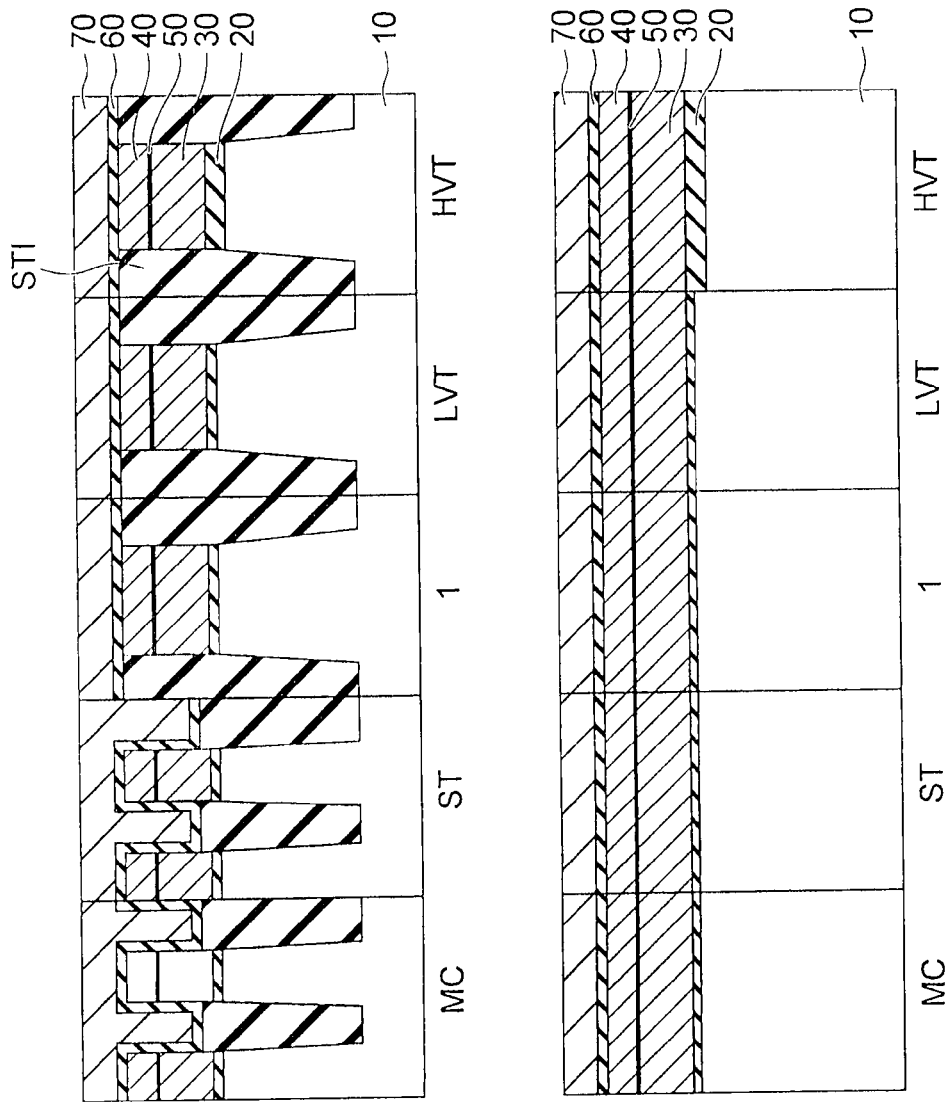

As shown in FIGS. 13A and 13B, a first material (third conductive layer) of the control gate 70 is deposited on the IPD film 60 by the LPCVD or the like. For example, the first material of the control gate 70 is doped silicon containing impurities such as phosphorus, arsenic, or boron or a silicon film that does not contain any impurities. However, if the silicon film that does not contain any impurities is used as the first material of the control gate 70, it is necessary to change the property of the first material of the control gate 70 to electric conductivity by impurity implantation, silicidation or the like in a later process.

Figures 14A, 14B:
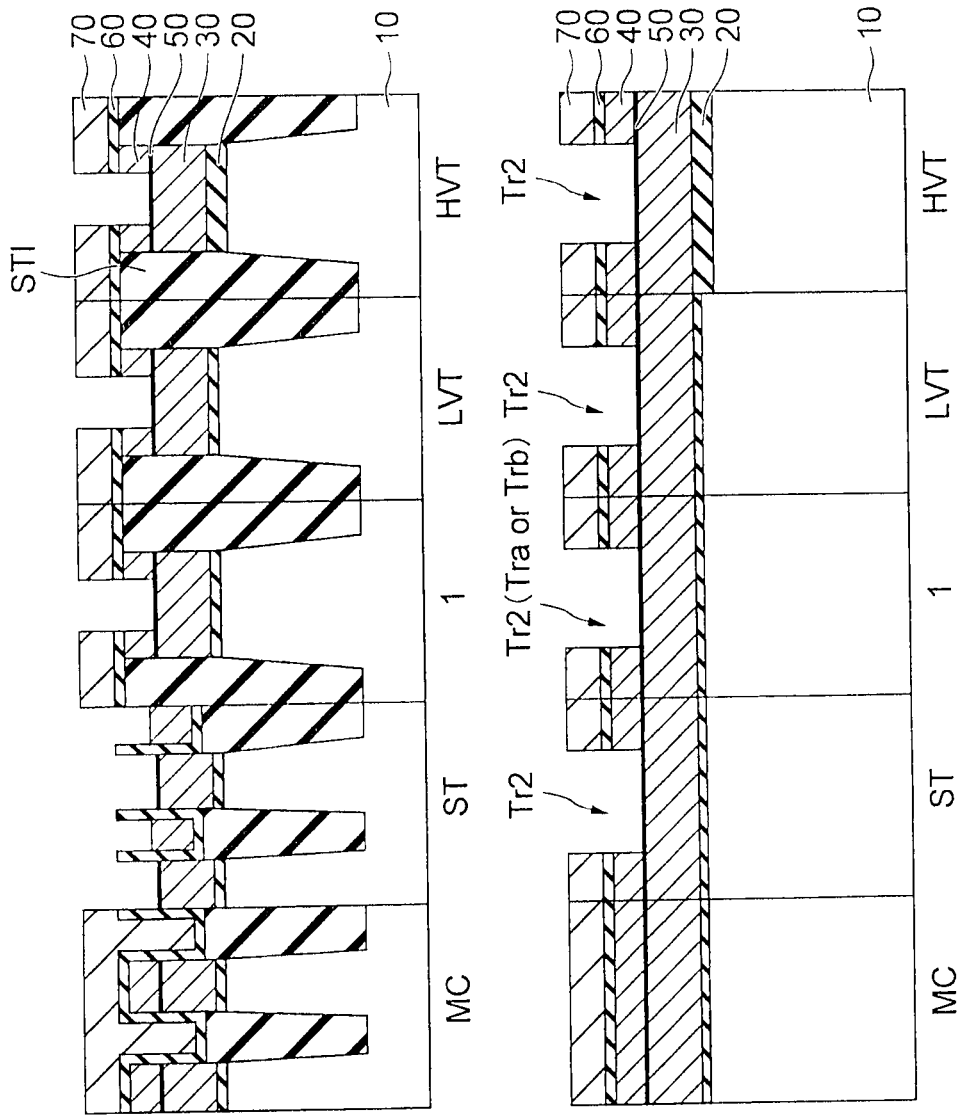

As shown in FIGS. 14A and 14B, the control gate 70, the IPD film 60, and the second floating gate 40 in the IPD etching regions EIa and EIb are etched by the lithography and the RIE or CDE. At this time, the stopper film 50 functions as the etching stopper as described above.

To etch the IPD etching regions EIa and EIb is intended to electrically short-circuit the control gate 70 to the first and second floating gates 30 and 40 and to thereby allow the control gate 70 and the first and second floating gates 30 and 40 to function as one gate electrode in each of the regions of forming the selective transistor ST and the peripheral transistors LVT and HVT. To etch the IPD etching regions EIa and EIb is also intended to form the connection parts 72a and 72b (see FIG. 1B) on the both ends of the resistance element 1. Needless to say, the IPD film 60 is not removed in the region of forming the memory cells MC.

For example, it is assumed here that the stopper film 50 is the silicon oxide film, the control gate 70 and the first and second floating gates 30 and 40 are made of the doped polysilicon, and that the IPD film 60 is a multilayer film of the silicon oxide film and the silicon nitride film. On this assumption, the control gate 70 and the IPD film 60 are etched first under the conditions of etching all the silicon oxide films, the silicon nitride film, and the silicon. At a time when the IPD film 60 is completely eliminated, the silicon is selectively etched and the etching conditions are changed to those under which the silicon oxide films are difficult to etch. The second floating gate 40 present on the stopper film 50 can be thereby eliminated. In this way, the stopper film 50 functions as the etching stopper during the etching of the second floating gate 40. Trenches Tr2, the bottoms of which correspond to the surface of the stopper film 50, are thereby formed. The trenches Tr2 are formed in the IPD etching regions EIa and EIb shown in FIG. 5B. As shown in FIG. 14B, the provision of the stopper film 50 makes uniform etching depths of the second floating gate 40 (depths of the trenches Tr2) on the surface of the stopper film 50. That is, it is possible to suppress fluctuations in the depths of the trenches Tr2.

The trenches Tr2 formed in the IPD etching regions EIa and EIb shown in FIG. 5B are also referred to as "first trenches Tra" and "second trenches Trb" hereinafter, respectively.

Figures 15A, 15B:
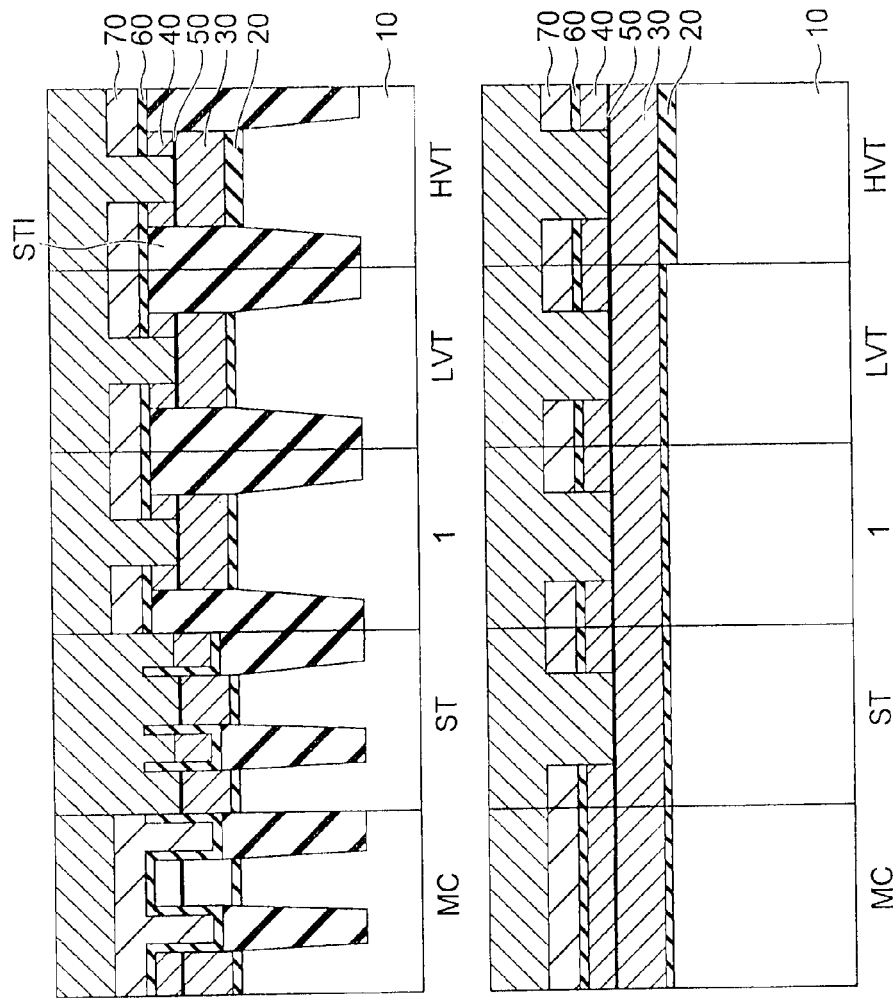

As shown in FIGS. 15A and 15B, a second material (fourth conductive layer) of the control gate 70 is deposited in the trenches Tr2 and the surface of the second material is planarized. The second material of the control gate 70 is doped polysilicon or metal such as tungsten, for example. If the doped polysilicon is used as the second material of the control gate 70, at least a part of the doped polysilicon is preferably silicided so as to reduce the entire resistance of the control gate 70. This second material of the control gate 70 enables electrical connection of the first and second conductive parts 70a and 70b to the first and second resistance parts 30 and 40 in the region of forming the resistance element 1. In each of the regions of forming the selective transistor ST and the peripheral transistors LVT and HVT, the control gate 70 is electrically connected to the first and second floating gates 30 and 40, and the control gate 70 and the first and second floating gates 30 and 40 are formed into an integral gate electrode.

Thereafter, the materials of the control gate 70 are processed by the lithography, RIE and the like. As a result, the control gates 70 shown in FIG. 5A are formed.

At this time, as shown in FIG. 5B, the materials of the control gates 70 are removed in the CG etching regions GEa and GEb. Portions of the control gates 70 in which the first trenches Tra are buried are used as the first connection parts 72a whereas portions of the control gates 70 in which the second trenches Trb are buried are used as the second connection parts 72b. The portions of the control gates 70 are electrically isolated from each other.

Thereafter, the interlayer dielectric film ILD, the contact plugs 80a and 80b, and wirings (not shown) are formed. Thus, the NAND EEPROM according to the first embodiment is completed.

As explained above, according to the first embodiment, the resistance element 1 can be manufactured in common manufacturing processes by using the materials common to the resistance element 1, the memory cells MC, the selective transistors ST, and the transistors LTV and HTV. This can reduce the manufacturing cost of the semiconductor device according to the first embodiment.

Furthermore, in the resistance element 1, the first and second resistance parts 30 and 40 are films formed in the same layers as those in which the first and second floating gates 30 and 40 are formed in the memory cells MC. The reasons for this are as follows.

Normally, a control gate or a metal wiring is incomparably lower in the resistance than a floating gate. For example, while the floating gate has a sheet resistance of several hundreds of ohm/square, the control gate has a sheet resistance of about 10 ohm/square or lower and the metal wiring has a sheet resistance of several ohm/square. This is because phosphorus-doped polysilicon is used for the floating gate whereas low-resistance silicide or metal (such as tungsten or copper) is used for the control gate and the metal wiring so as to accelerate the operating rate of a circuit. Accordingly, when the resistance element 1 having a desired resistance is to be formed by using either the control gates 7 or metal wirings, the layout area of the resistance element 1 becomes large. On the other hand, the use of the first and second floating gates 30 and 40 can make the layout area of the resistance element 1 relatively small. For these reasons, the first and second resistance parts 30 and 40 are formed by films in the same layers as those in which the first and second floating layers 30 and 40 are formed.

In the manufacturing process described above, a sidewall transfer processing method by using a sidewall as a mask is occasionally used to form elements that are finer than those formed by lithographically. The manufacturing method according to the first embodiment can be performed by means of this processing method by using a sidewall in place of lithography.

Second Embodiment

Figure 16:
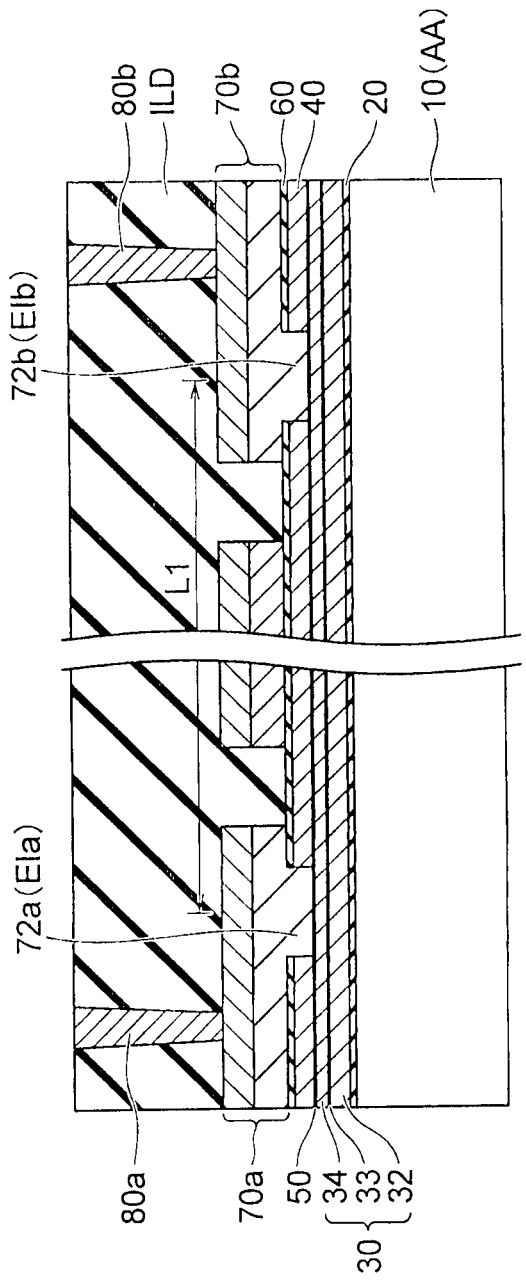
FIG. 16 is a cross-sectional view showing a configuration of the resistance element 1 of a semiconductor device according to a second embodiment.

FIG. 16 is a cross-sectional view showing a configuration of the resistance element 1 of a semiconductor device according to a second embodiment. In the second embodiment, the first resistance part 30 is a multilayer film in which a conductive layer 32, an insulation film 33, and a conductive layer 34 are stacked in this order. The stopper film 50 is provided on the conductive layer 34 that is the uppermost layer of the multilayer film. That is, while the resistance parts 30 and 40 are the multilayer films of the double-layer structure according to the first embodiment, the resistance parts 30 and 40 are the multilayer films of a triple-layer structure according to the second embodiment.

The conductive layers 32 and 34 can be formed by the same material as that of the first resistance part 30 according to the first embodiment. Alternatively, the material of the conductive layer 32 can be different from that of the conductive layer 34. The insulation film 33 can be formed by the same material as that of the stopper 50, although not limited thereto.

Other configurations of the resistance element 1 according to the second embodiment can be identical to those of the resistance element 1 according to the first embodiment.

The first and second floating gates 30 and 40 of each of the memory cells MC are also multilayer films of a triple-layer structure because the first and second resistance parts 30 and 40 in the resistance element 1 are the multilayer films of the triple-layer structure.

Figure 17:
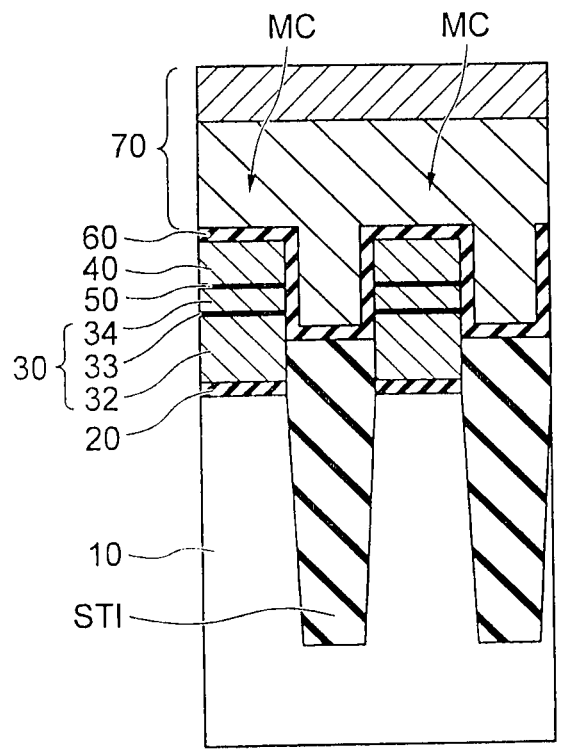
FIG. 17 is a cross-sectional view showing a configuration of the memory cells MC included in the semiconductor device according to the second embodiment.
Figure 18:
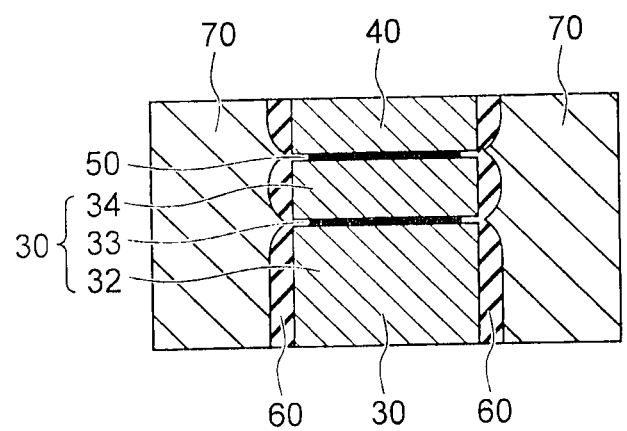
FIG. 18 is a cross-sectional view of a boundary between the first and second floating gates 30 and 40 shown in FIG. 17.

FIG. 17 is a cross-sectional view showing a configuration of the memory cells MC included in the semiconductor device according to the second embodiment. FIG. 18 is a cross-sectional view of a boundary between the first and second floating gates 30 and 40 shown in FIG. 17.

In each of the memory cells MC, the first floating gate (first resistance part) 30 is also the multilayer film in which the conductive layer 32, the insulation film 33, and the conductive layer 34 are stacked in this order. As shown in FIG. 18, the control gate 70 is opposed to the side surface of the multilayer film in the first floating gate 30 via the IPD film 60.

As described above with reference to FIG. 4, the constrictions formed on the side surfaces of the first and second floating gates 30 and 40 can increase the coupling capacitance between the first and second floating gate 30 and 40 and the control gate 70.

When the number of insulation films and conductive layers stacked as the materials of the floating gates increases in the first and second floating gates 30 and 40 as in the second embodiment, the number of constrictions on the side surfaces of the first and second floating gates 30 and 40 can increase. This can further increase the areas by which the first and second floating gates 30 and 40 are opposed to the control gate 70. As a result, this can further increase the coupling capacitance between the first and second floating gates 30 and 40 and the control gate 70, and improve the controllability over the memory cells MC.

The second embodiment also includes the stopper film 50, and therefore the second embodiment can also achieve effects identical to those of the first embodiment.

In the first floating gate (first resistance part) 30, the number of insulation films and conductive layers alternately stacked can be further increased. This can further increase the coupling capacity between the first and second floating gates 30 and 40 and the control gate 70.

When the second floating gate 40 is a multilayer film including insulation films and conductive layers, the insulation film serving as an uppermost layer functions as the stopper film 50. Therefore, a mode in which the second floating gate 40 is the multilayer film is substantially identical to the mode in which the first floating gate 30 is the multilayer film.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
    a semiconductor substrate;
    a first insulation film on the semiconductor substrate;
    a first resistance part on the first insulation film, the first resistance part being made of a conductive layer;
    a boundary film directly on the first resistance part;
    a second resistance part on a top surface of the boundary film, the second resistance part being made of a conductive layer;
    a second insulation film on the second resistance part; and
    a first conductive part and a second conductive part on the second insulation film, the first conductive part and the second conductive part being isolated from each other, wherein
    the first conductive part comprises a first connection part penetrating the second insulation film and the second resistance part and contacting a surface of the boundary film,
    the second conductive part comprises a second connection part penetrating the second insulation film and the second resistance part and contacting a surface of the boundary film, and
    the first resistance part is electrically connected to the first conductive part via the first connection part, and electrically connected to the second conductive part via the second connection part.

2. The device of claim 1, further comprising a plurality of memory cells, wherein
    each of the memory cells comprises:
    the first insulation film on the semiconductor substrate;
    a charge storage layer on the first insulation film;
    the second insulation film on the charge storage layer; and
    a control gate on the second insulation film, wherein
    the charge storage layer comprises a film in a same layer as a layer in which the first resistance part is present, and a film in a same layer as a layer in which the second resistance part is present, and the control gate comprises a film in a same layer as a layer in which the first and second conductive parts are present.

3. The device of claim 1, wherein a thickness or a depth of the first connection part is substantially equal to that of the second connection part.

4. The device of claim 2, wherein a thickness or a depth of the first connection part is substantially equal to that of the second connection part.

5. The device of claim 1, wherein a contact area between the first connection part and the boundary film is substantially equal to a contact area between the second connection part and the boundary film, and a contact area between the first connection part and the second resistance part is substantially equal to a contact area between the second connection part and the second resistance part.

6. The device of claim 2, wherein a contact area between the first connection part and the boundary film is substantially equal to a contact area between the second connection part and the boundary film, and a contact area between the first connection part and the second resistance part is substantially equal to a contact area between the second connection part and the second resistance part.

7. The device of claim 3, wherein a contact area between the first connection part and the boundary film is substantially equal to a contact area between the second connection part and the boundary film, and a contact area between the first connection part and the second resistance part is substantially equal to a contact area between the second connection part and the second resistance part.

8. The device of claim 1, wherein the first resistance part is a multilayer film having insulation films and conductive layers alternately stacked, and the boundary film is provided on the conductive layer on an uppermost layer of the multilayer film.

9. The device of claim 2, wherein the first resistance part is a multilayer film having insulation films and conductive layers alternately stacked, and the boundary film is provided on the conductive layer on an uppermost layer of the multilayer film.

10. The device of claim 3, wherein the first resistance part is a multilayer film having insulation films and conductive layers alternately stacked, and the boundary film is provided on the conductive layer on an uppermost layer of the multilayer film.

11. The device of claim 4, wherein the first resistance part is a multilayer film having insulation films and conductive layers alternately stacked, and the boundary film is provided on the conductive layer on an uppermost layer of the multilayer film.

12. The device of claim 2, wherein the first resistance part is a multilayer film provided in the charge storage layer and has insulation films and conductive layers alternately stacked, and the control gate is opposed to a side surface of the multilayer film in the charge storage layer via the second insulation film.

\* \* \* \* \*